(12) United States Patent
West

(10) Patent No.: US 6,830,459 B2
(45) Date of Patent: Dec. 14, 2004

(54) HIGH CURRENT, HIGH MECHANICAL STRENGTH CONNECTORS FOR INSULATED METAL SUBSTRATE CIRCUIT BOARDS

(76) Inventor: Richard Travis West, 3547-C S. Higuera St., San Luis Obispo, CA (US) 93401

( * ) Notice: Subject to any disclaimer, the term of this patent is extended or adjusted under 35 U.S.C. 154(b) by 42 days.

(21) Appl. No.: 10/248,827

(22) Filed: Feb. 21, 2003

(65) Prior Publication Data

US 2004/0166709 A1 Aug. 26, 2004

(51) Int. Cl.[7] .......................... H01R 12/00; H05K 1/00
(52) U.S. Cl. .................................. 439/63; 174/138 G
(58) Field of Search ........................... 439/63, 74, 581; 174/138 G

(56) References Cited

U.S. PATENT DOCUMENTS 5,380,211 A * 1/1995 Kawaguchi et al. .......... 439/74
5,715,141 A * 2/1998 Karlsson ..................... 361/707

* cited by examiner

Primary Examiner—Javaid H. Nasri

(57) ABSTRACT

The invention is a method of and devices for making electrical connections to an Insulated Metal Substrate (IMS) printed circuit board. The approach is novel. The invention enables IMS type materials to be cost-effectively used with much higher currents. The invention also enables the substrate layer to be used as an active circuit layer.

3 Claims, 4 Drawing Sheets

NOTE: THICKNESS OF LAYERS ARE EXAGGERATED FOR CLARITY.

TOP VIEW

SECTION A-A

BOTTOM VIEW

HIGH CURRENT PCB TERMINAL

SECTION C-C

SECTION D-D

END VIEW

HIGH CURRENT COAXIAL
CONNECTOR LINK

END VIEW

HIGH CONDUCTIVITY LOCK NUT

NOTE: THICKNESS OF LAYERS ARE EXAGERATED FOR CLARITY.

NOTE: THICKNESS OF LAYERS ARE EXAGERATED FOR CLARITY.

HIGH CURRENT, HIGH MECHANICAL STRENGTH CONNECTORS FOR INSULATED METAL SUBSTRATE CIRCUIT BOARDS

BACKGROUND OF INVENTION

This invention pertains to power electronics design and manufacture. Specifically, the invention pertains to high current electrical connector designs that provide connections to Insulated Metal Substrate (IMS) circuit boards.

IMS circuit board materials are comprised of a metal substrate, usually aluminum or copper with a typical thickness from 0.040" to 0.125". A thin insulating material is bonded to the substrate and a layer of copper foil is bonded to the insulating material.

The IMS material is processed into printed circuit boards (PCBs) in much the same way as a typical fiberglass PCB where a photo mask is applied to the copper foil and the unwanted copper is chemically etched away, leaving the desired traces and pads.

For high power applications, IMS printed circuit boards have only one usable layer and are only suitable for surface mount components. Fiberglass boards can have many layers and a mix of through-hole and surface mount components. The value of the IMS material is in the very low thermal resistance from copper component mounting pad to the metal substrate. In high power applications, the substrate is in turn mounted to a heatsink. This allows surface mount semiconductor components such as transistors, rectifiers and SCRs to operate with low thermal resistance from device junction to ambient air. Low thermal resistance enables higher power to be processed with less silicon die area, which translates to lower costs.

There are two problems with the IMS materials for high power applications. First, the mechanical strength of the bond between the copper and insulating material and insulating material and substrate is limited. This weakness precludes the use of large, soldered, surface mounted terminals where high sheer and pull strength is required to reliably hold large cables. The prior art is to use multiple low-current surface mount connectors, pins or headers to make the transition to a fiberglass PCB. A single, high current, high mechanical strength termination could then be made on the fiberglass PCB. Second, the metal substrate layer is typically used only for mechanical support and heat transfer. It is desirable in most high power, high frequency switching applications to have a low impedance DC bus. This requires a two layer circuit board or other laminated bus assembly. The IMS material is limited by having only one easily accessible layer. In lower power applications an IMS board can be configured with a second copper layer but the heat transfer characteristics are compromised and the added cost may be prohibitive. Additionally, the problem of connecting large through-hole electrolytic capacitors to the to the circuit layers to achieve a low AC impedance bus is not solved.

BRIEF SUMMARY OF THE INVENTION

The invention solves the two problems stated in the background discussion. First, a device will be disclosed that allows a high current connection to be made from an IMS printed circuit board to a wire or to a second printed circuit board. The connection will have high sheer and pull strength and is independent of the IMS insulating material bond strength. Second, a device and method will be disclosed for making a high current, low impedance, electrical connection from both the top copper foil and the IMS substrate to a second printed circuit board. This allows the IMS substrate to be used as an active circuit plane in conjunction with all or part of the top IMS copper foil to create a low AC impedance bus structure. This also allows a low AC impedance, coaxial connection with a fiberglass board where the fiberglass board is able to carry the larger through-hole components, such as electrolytic capacitors, relays and terminal blocks that the IMS board cannot.

DETAILED DESCRIPTION OF THE INVENTION

The invention consists of two methods of making high current connections to an IMS printed circuit board and three novel hardware devices to facilitate these two methods. The first method, illustrated in FIG. 4 uses the high current PCB terminal shown in FIG. 1. The second method illustrated in FIG. 5 uses the high current coaxial connector link shown in FIG. 2 and the high conductivity lock nut shown in FIG. 3.

Figure 1:
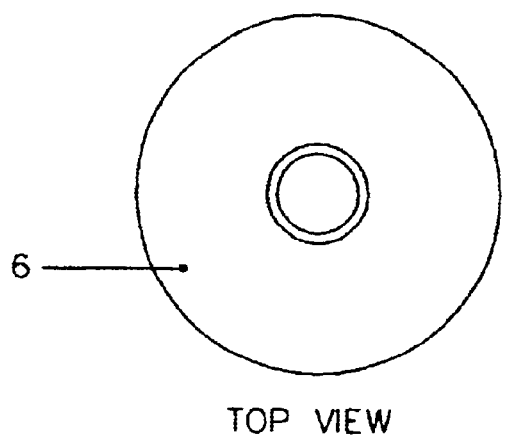
FIG. 1 illustrates cross sectional, top and a bottom views of an insulated, screw-on, high current PCB terminal for use with IMS circuit boards.
Figure 1:
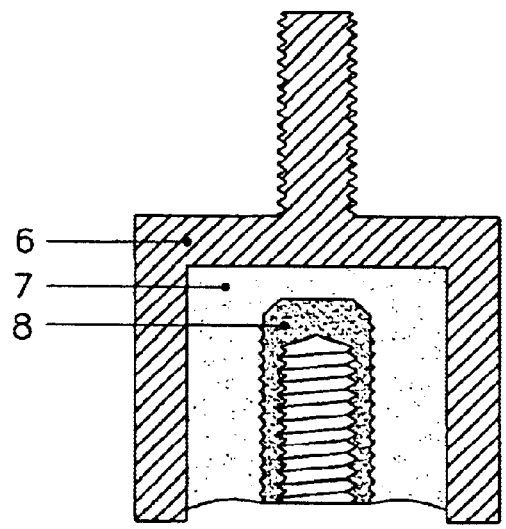
Figure 1:
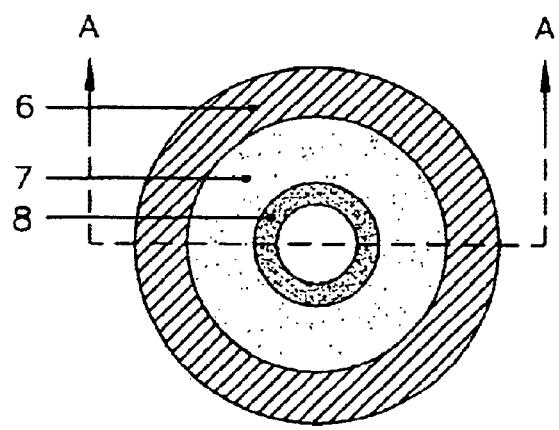

The high current PCB terminal, illustrated in FIG. 1 comprises three parts; metal cap 6 with a threaded machine screw stud on the top of the cap, electrically insulating material 7 and threaded machine screw insert 8. Threaded machine screw insert 8 has knurls around the outside diameter of the insert. Also, the preferred embodiment would use a potting compound for insulating material 7. To simplify the discussion on how this terminal is applied; the composite device of elements 6, 7 and 8 will be referred to as terminal 1.

Figure 4:
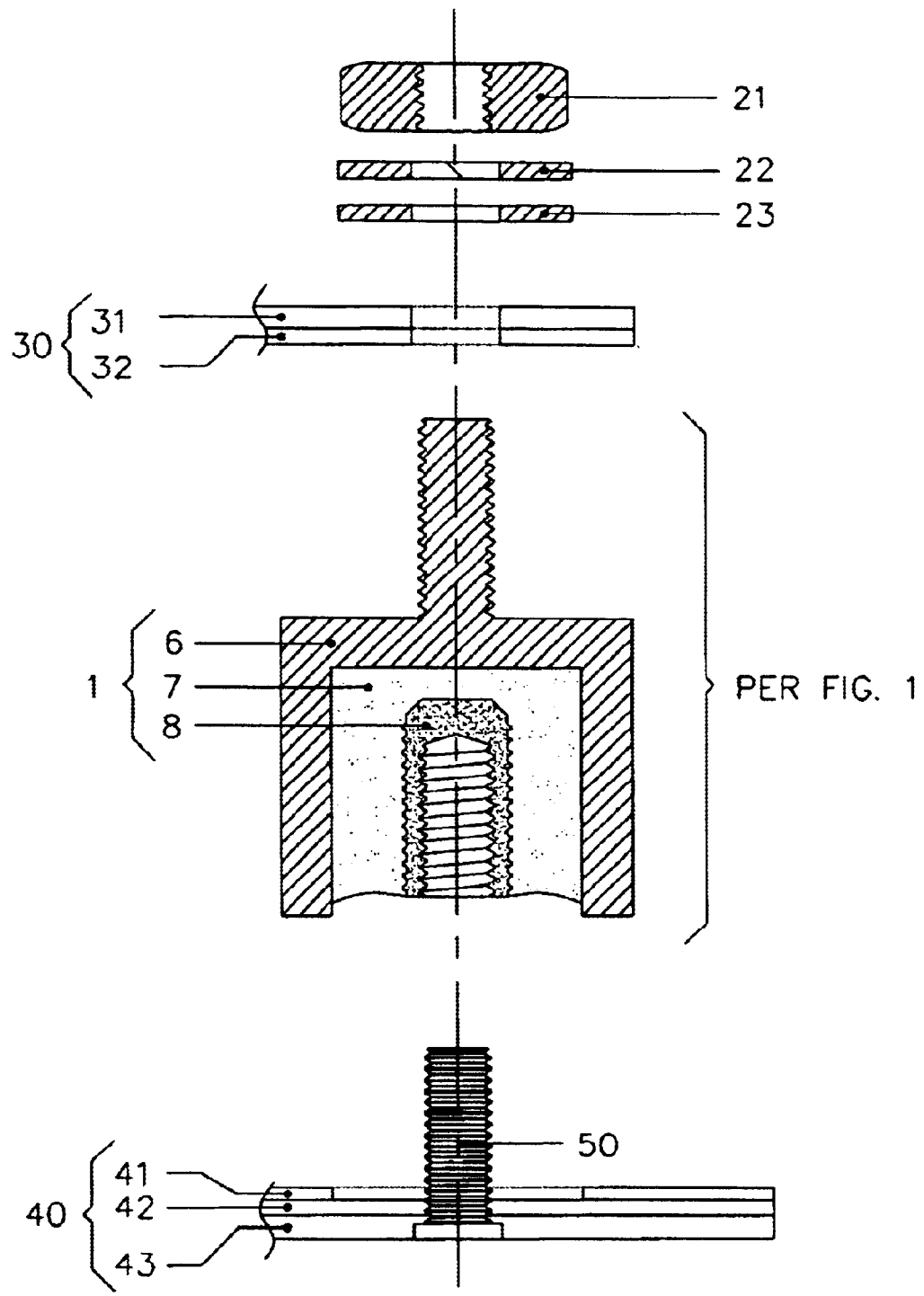
FIG. 4 illustrates a cross sectional view of an insulated, screw-on, high current PCB terminal as used with an IMS circuit board. This figure illustrates how PCB to PCB electrical connections are made.

FIG. 4 illustrates the first method of making IMS connections with a typical application for the high current PCB terminal 1 (FIG. 1) where a low resistance connection is made between IMS PCB 40 and fiberglass PCB 30. Top copper foil layer 41 of IMS PCB 40 is etched to remove the copper foil within a prescribed radius to provide voltage clearance between self-clinching machine screw stud 50, stud 50 is installed into metal substrate 43 of IMS PCB 40, flush with the bottom surface of IMS PCB 40. Terminal 1 is screwed onto stud 50 making electrical contact with top foil 41 of IMS PCB 40. In the preferred embodiment, terminal 1 is soldered to top foil 41 of IMS PCB 40 around the bottom outside circumference of terminal 1 or under the mating surface ring area using reflow solder paste. This arrangement provides a high current, high strength terminal that is electrically isolated from the IMS substrate material. Fiberglass PCB 30 has a clearance hole for the machine stud on terminal 1 and is fastened to terminal 1 with standard flat washer 23, lock washer 22 and hex nut 21 thus making a solid electrical compression contact between terminal 1 and bottom foil 32 of fiberglass PCB 30. This assembly provides a low resistance high current connection between top foil 41 of the IMS PCB 40 and bottom foil 32 of fiberglass PCB 30 and also provides a means of mounting fiberglass PCB 30. Additionally, a wire with a ring terminal may be fastened to the machine stud on terminal 1, with or without the inclusion of PCB 30.

Figure 2:
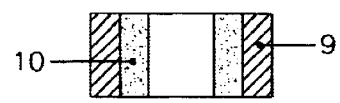
FIG. 2 illustrates a cross sectional view and an end view of a high current coaxial connector link for use between two printed circuit boards.
Figure 2:
Figure 2:
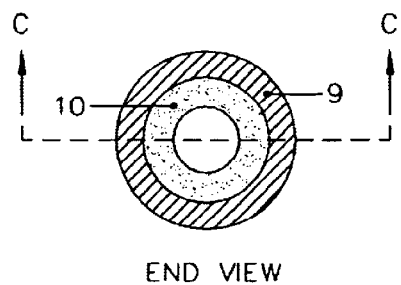

The high current coaxial connector link illustrated in FIG. 2 comprises two parts; outside metal ring 9 and bushing 10. Bushing 10 is made of an electrically insulating material and has a center clearance hole.

Figure 3:
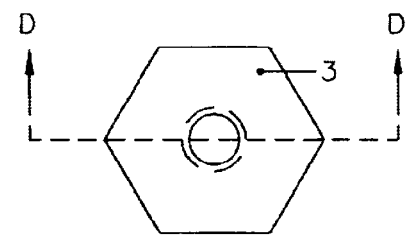
FIG. 3 illustrates a cross sectional view and an end view of a high conductivity lock nut to be used in conjunction with the coaxial link illustrated in FIG. 2.

The high conductivity locknut illustrated in FIG. 3 is fabricated in one piece with an outside width and thickness much larger than standard hex nuts in proportion to the thread size to extend the bearing surface without using a fender washer. The threads are slightly deformed to provide lower electrical contact resistance and to lock the nut in position. The deformed threads are specifically designed to enable an electrical connection with significantly greater contact area, on the microscopic level, between the machine screw threads and the nut threads. This self-locking nut design also reduces the number of interfaces that current must flow through from three; nut-to-lock washer, lock washer-to-flat washer, flat washer-to-PCB foil to one; nut-to-PCB foil. The base metal and plating materials in the preferred embodiment are selected for high electrical conductivity and corrosion resistance.

Figure 5:
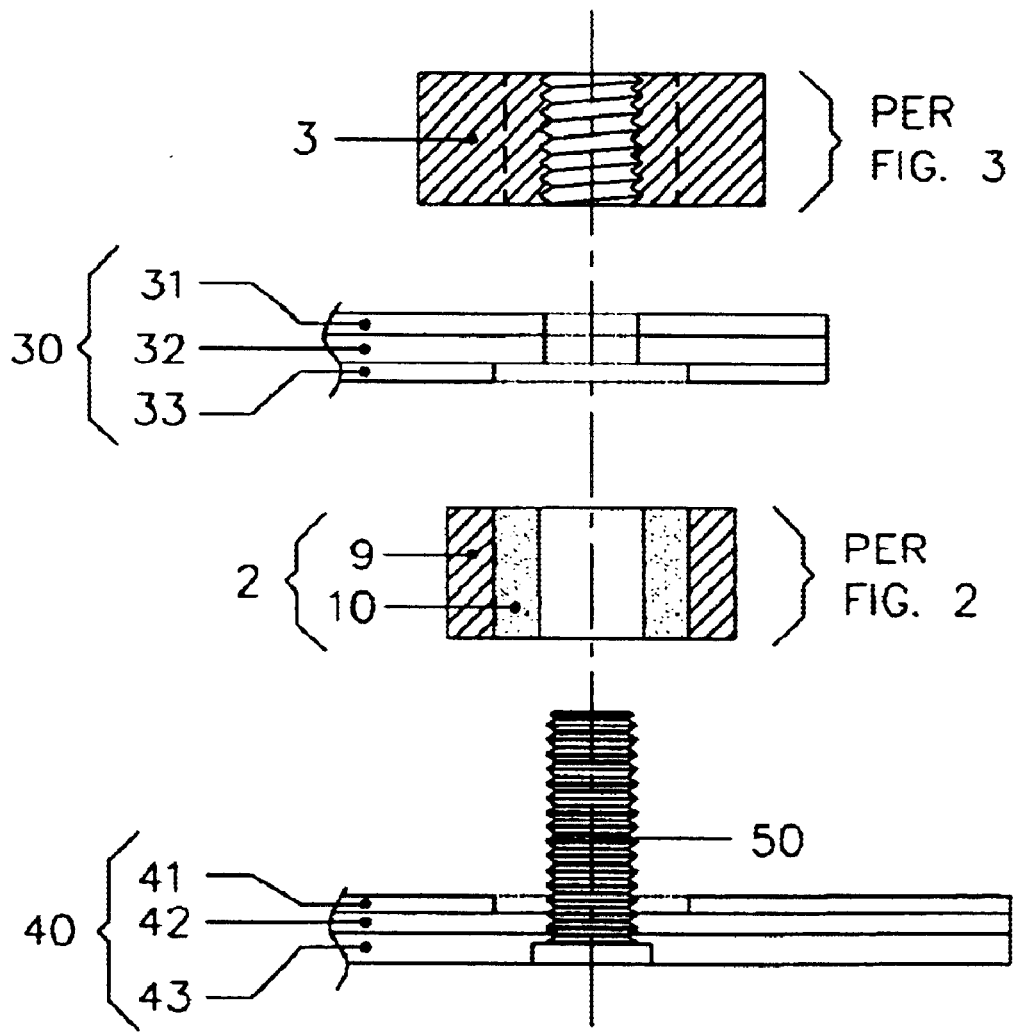
FIG. 5 illustrates a cross sectional view of a high current, coaxial PCB to PCB link as used with an IMS printed circuit board and a second fiberglass PCB. This figure illustrates how two PCB to PCB electrical circuit connections are made using the link illustrated in FIG. 2, the lock nut illustrated in FIG. 3 and a self-clinching machine screw stud.

FIG. 5 illustrates the second method of making IMS connections with a typical application for high current coaxial connector link 2 (FIG. 2) and the high conductivity locknut 3 (FIG. 3) where the substrate 43 of IMS PCB 40 is used as an active electrical conductor and where two, high current connections are brought from IMS PCB 40 to fiberglass PCB 30 with very low AC impedance between the two conductors. Coaxial link 2, the composite assembly of elements 9 and 10, is placed over self-clinching machine stud 50, fiberglass PCB 30 is placed over machine stud 50 and the assembly is fastened together with high conductivity nut 3. The resulting electrical circuit is a low resistance connection between top foil 41 of IMS PCB 40 through the coaxial link 2 to bottom foil 33 of fiberglass PCB 30 and a second autonomous circuit with a press-fit metal connection between IMS PCB substrate 43 and self-clinching machine stud 50, through stud 50, then through nut 3, to top foil 31 of fiberglass PCB 30. The AC impedance between these two autonomous current paths is very low due to the geometry of conductor link 2.

This second method allows the use of IMS substrate layer 43 as an active power plane to form a low AC impedance DC bus structure on IMS PCB 40 and allows this low AC impedance characteristic to be maintained between IMS PCB 40 and energy storage capacitors on adjacent fiberglass PCB 30 and without stressing the mechanical bonds of IMS insulating layer 42.

What is claimed is:

1. A method of and devices for making two simultaneous high-current electrical connections, from an Insulated Metal Substrate (IMS) Printed Circuit Board (PCB) to a second PCB and substantially using four basic components; a self-clinching machine screw stud, an electrically insulating bushing having a center through hole, an electrically conductive ring, and an electrically conductive machine nut having a large bearing surface area and where said self-clinching machine screw stud is installed in the IMS PCB, the insulating bushing is installed over and then around the self-clinching stud, the conductive ring is installed over and then around the insulating bushing, the second PCB with a clearance hole for the self-clinching stud is attached to the stud with the machine nut and tightened thus clamping the conductive ring between the two circuit boards and furthermore where this arrangement makes two electrical connections; one between a top conductor foil of the IMS PCB, through the conductive ring, to a bottom conductor foil on the second PCB and a second, autonomous circuit connection common to the IMS PCB metal substrate and the self-clinching stud, through said stud and then thru the machine nut to a top conductor foil on the second PCB.

2. A method of and device for making high-current electrical connections from an Insulated Metal Substrate (IMS) Printed Circuit Board (PCB) to a second PCB and substantially comprising three parts; a metal cap with a threaded machine screw stud on the top of said cap and having a concave cup in the bottom of said cap, a threaded female machine screw insert located within said concave cup of said cap and an electrically insulating material that holds said threaded female machine screw insert in place and also electrically insulates said cap from said insert.

3. A method of and device for making high-current electrical connections from an Insulated Metal Substrate (IMS) Printed Circuit Board (PCB) according to claim 2 where a ring lug is substituted for said second PCB.

* * * * *